US008253092B2

(12) United States Patent
Vigier-Blanc et al.

(10) Patent No.: US 8,253,092 B2
(45) Date of Patent: Aug. 28, 2012

(54) OPTICAL DIE WITH VARIABLE REFRACTIVE INDEX, CORRECTIVE OF NEGATIVE DISTORTION, AND METHOD OF FABRICATING SUCH A DIE

(75) Inventors: Emmanuelle Vigier-Blanc, Le Sappey en Chartreuse (FR); Guillaume Cassar, Grenoble (FR); Thierry Lepine, Saint-Heand (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 315 days.

(21) Appl. No.: 12/496,276

(22) Filed: Jul. 1, 2009

(65) Prior Publication Data

US 2010/0001176 A1 Jan. 7, 2010

(30) Foreign Application Priority Data

Jul. 2, 2008 (FR) ..................................... 08 54470

(51) Int. Cl.
*H01J 3/14* (2006.01)
*H01L 27/00* (2006.01)

(52) U.S. Cl. .................................... 250/216; 250/208.1

(58) Field of Classification Search .................. 359/642, 359/652–654; 250/208.1, 208.2, 239, 216; 257/414, 431–436, 678; 438/57, 64, 65, 438/69–72
See application file for complete search history.

(56) References Cited

U.S. PATENT DOCUMENTS

| | | | | |
|---|---|---|---|---|
| 4,639,094 | A | 1/1987 | Aono | |
| 4,805,997 | A | 2/1989 | Asahara et al. | |
| 5,136,428 | A * | 8/1992 | Ray | 359/654 |
| 5,870,638 | A * | 2/1999 | Kurosawa | 396/267 |
| 6,232,590 | B1 | 5/2001 | Baek | |
| 7,868,284 | B2 * | 1/2011 | Vigier-Blanc et al. | 250/208.1 |
| 7,876,504 | B2 * | 1/2011 | Vigier-Blanc et al. | 359/652 |
| 2006/0254316 | A1 * | 11/2006 | Leu | 65/30.13 |
| 2007/0145242 | A1 * | 6/2007 | Toyoda et al. | 250/208.1 |
| 2009/0190231 | A1 * | 7/2009 | Lenchenkov | 359/654 |

FOREIGN PATENT DOCUMENTS

EP 1424570 6/2004

OTHER PUBLICATIONS

French Search Report cited in Application No. FR0854470, dated Jan. 20, 2009 (2 pages).

* cited by examiner

*Primary Examiner* — Pascal M Bui Pho
(74) *Attorney, Agent, or Firm* — Gardere Wynne Sewell LLP

(57) ABSTRACT

An optical die, which is intended to be placed in front of an optical sensor of a semiconductor component, has an optically useful zone having an optical axis and exhibiting a variable refractive index. Specifically the refractive index of the die is variable in an annular peripheral zone lying between a radius Ru enveloping the useful zone and a smaller radius Ro. The index varies as a function of radial distance from a lower value near the smaller radius Ro to a higher value near the radius Ru. The function of the variable refractive index lies between a maximum and minimum profile.

10 Claims, 8 Drawing Sheets

10
7
8
1
5
8a
6
3
3a
4
2

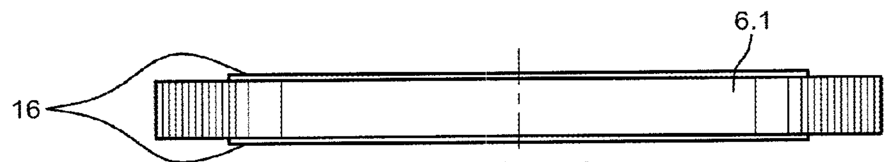
FIG.13
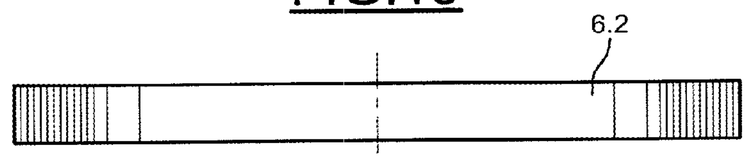
FIG.14
13
FIG.15
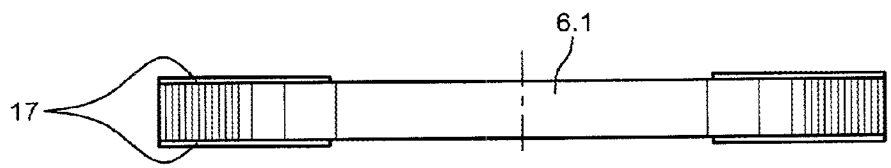
FIG.16
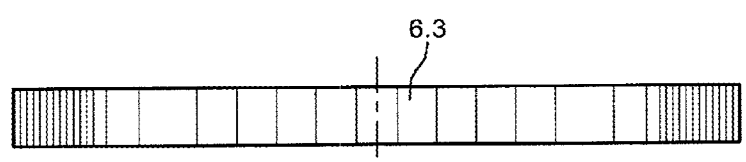
FIG.17
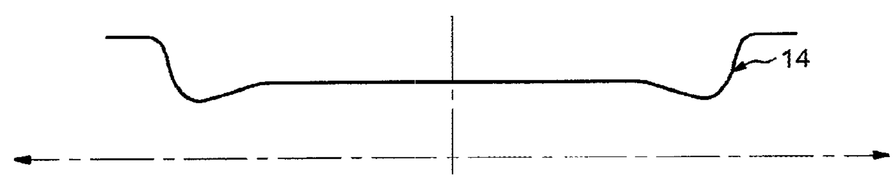
FIG.18

OPTICAL DIE WITH VARIABLE REFRACTIVE INDEX, CORRECTIVE OF NEGATIVE DISTORTION, AND METHOD OF FABRICATING SUCH A DIE

PRIORITY CLAIM

This application claims the benefit of French Application for Patent No. 08-54470 of the same title filed Jul. 2, 2008, the disclosure of which is hereby incorporated by reference.

TECHNICAL FIELD

The present invention relates to the field of optical modules intended to be placed in front of optical sensors of semiconductor components and, more particularly, to the field of optical modules or dies intended to be placed in front of optical sensors of semiconductor components.

SUMMARY

According to one mode, a die may comprise an optically useful zone having an optical axis and exhibiting a variable refractive index, so that it is larger in its peripheral part than in its just adjacent interior part or in its central part.

In an annular peripheral zone, lying between a radius Ru enveloping the useful zone and a smaller radius Ro, the refractive index may lie between a maximum profile Pmax and a minimum profile Pmin.

The maximum profile Pmax may be such that between the radius Ro and a radius R1, the value of the maximum refractive index is defined, as a function of the distance from the center of the die r, by the formula:

$$n = n_0 + (n_1 - n_2) \cdot \frac{(r - R_0)^2}{(R_1 - R_0)^2}$$

and then that between this radius R1 and the radius Ru the refractive index is equal to a value $n_1$.

The minimum profile Pmin may be such that between the radius Ro and a radius R2 the refractive index is equal to a value $n_0$, and then that between this radius R2 and the radius Ru, the value of the minimum refractive index is defined, as a function of the distance from the center of the die r, by the formula:

$$n = n_0 + (n_3 - n_0) \cdot \frac{(r - R_2)^2}{(R_u - R_2)^2}$$

The values of the refractive indices may be such that $n_1$ is greater than $n_0$, $n_2$ lies between $n_0$ and $n_1$, and $n_3$ lies between $n_1$ and $n_2$.

The values of the radii may be such that R1 lies between Ro and Ru and R2 lies between Ro and Ru.

For example, $n_2$ may be equal to $n_0$ plus 2/10 of $(n_1-n_0)$ and $n_3$ may be equal to ½ of $(n_1+n_0)$.

For example, Ro may be equal to 3/5 of Ru, R1 may be equal to Ro plus ⅓ of (Ru−Ro) and R2 may be equal to Ro plus ⅞ of (Ru−Ro).

According to one embodiment, implanted ions may determine the variation in refractive index.

Moreover, grooves and/or through-holes situated outside the useful zone may be made in the die.

According to another mode, a method of making a die may comprise the following steps: making at least one mask on the central zone delimited by the radius Ro of at least one face of the die, or at least one mask outside this central part, and immersing the die in an ion bath so as to implant ions contained in this bath in the zones not covered by the mask.

A method may comprise the following steps: making at least one second mask different from the first mask, and immersing the die in a second ion bath so as to implant ions of this bath through the zones not covered by the second mask.

A method may comprise a step of rediffusion of the implanted ions.

The implantation may possibly be carried out under the effect of an acceleration electric field.

According to another embodiment, an optical semiconductor device may comprise a semiconductor component exhibiting an optical sensor and, in front of this optical sensor, an optical module comprising a die as defined above.

BRIEF DESCRIPTION OF THE DRAWINGS

Various embodiments of dies will now be described by way of nonlimiting examples illustrated by the drawing in which:

FIG. 13 represents a radial cut through a die equipped with a mask;

FIG. 14 represents a cut through the die of FIG. 13 after a treatment;

FIG. 15 represents a graph of the profile of the refractive index of the die of FIG. 14;

FIG. 16 represents a radial cut through a die equipped with a mask;

FIG. 17 represents a cut through the die of FIG. 16 after a treatment;

FIG. 18 represents a graph of the profile of the refractive index of the die of FIG. 17;

DETAILED DESCRIPTION OF THE DRAWINGS

Figure 1:
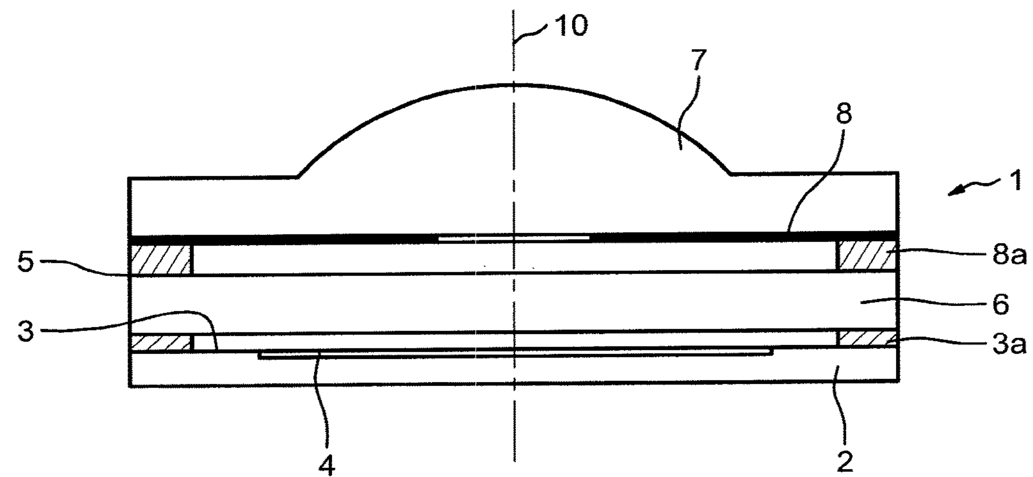
FIG. 1 represents a radial cut through a device comprising a die.

Referring to FIG. 1, it may be seen that represented therein is a stack 1 comprising a semiconductor component 2, for example flat and with a square contour, exhibiting at the center of a face 3 an optical sensor 4, for example rectangular, and an optical module 5 placed in front of the face 3, in contact with or a very small distance from this face by virtue of a peripheral spacing ring 3*a*, and intended to focus the light rays towards the optical sensor 4.

The optical module 5 can comprise a transparent die 6, for example made of glass, with parallel faces and a square contour corresponding to that of the semiconductor component 2. It may possibly furthermore comprise an optical lens 7 placed in front of the die 6, possibly with interposition of a diaphragm 8 and of a peripheral spacing ring 8*a*.

Figure 2:
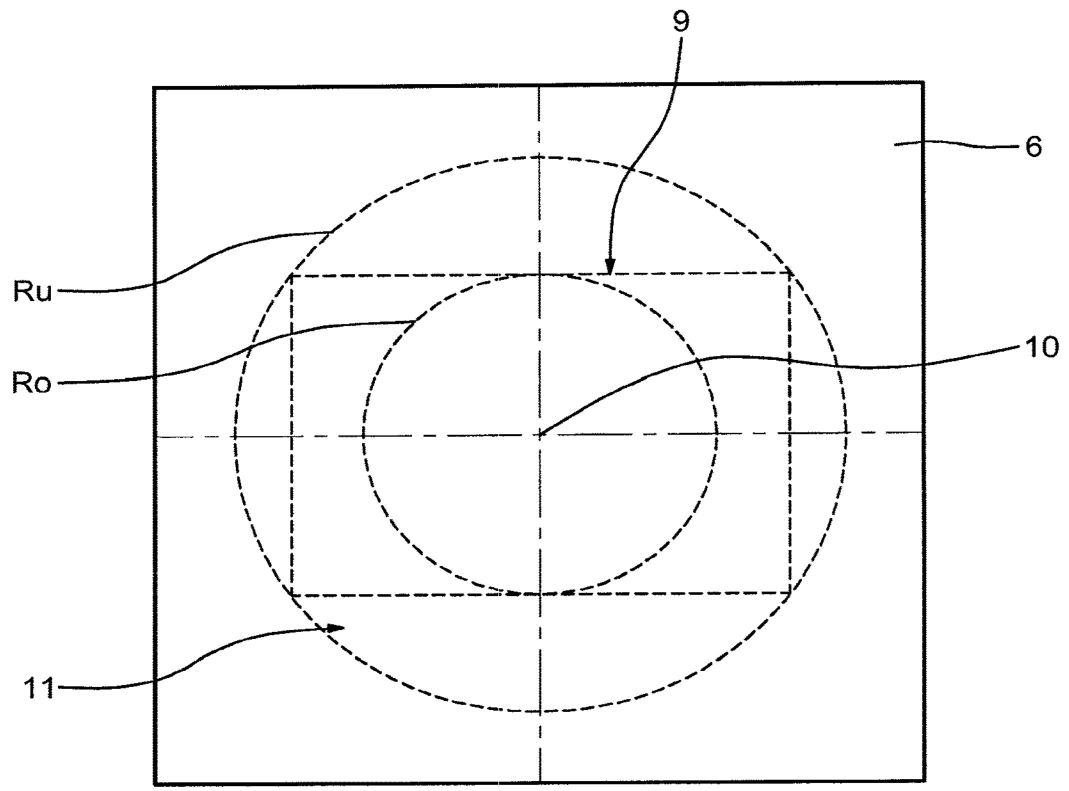
FIG. 2 represents a view from above of a die.

As shown in FIG. 2, the die 6 may exhibit an optically useful rectangular zone 9 corresponding to the optical sensor 4 and exhibiting the same optical axis 10 situated at the center.

It may be advantageous for the die 6 to exhibit a refractive index n, considered in relation to any radial plane, that can vary over at least an annular part between its center 10 and the periphery of its useful zone 9, being larger in its peripheral part than in its just adjacent interior part or in its central part.

In particular, the value of the refractive index n, considered in relation to any radial plane, may be variable over an annular peripheral zone 11 lying approximately between a radius Ru enveloping the useful zone 9 and a smaller radius Ro.

The radius Ru may be approximately equal to half a diagonal of the useful zone 9, whereas the radius Ro may for example be approximately equal to at least half the small side of the useful zone 9. Thus, the variation in the value of the refractive index may be more particularly achieved in the corners of the useful zone 9.

Figure 3:
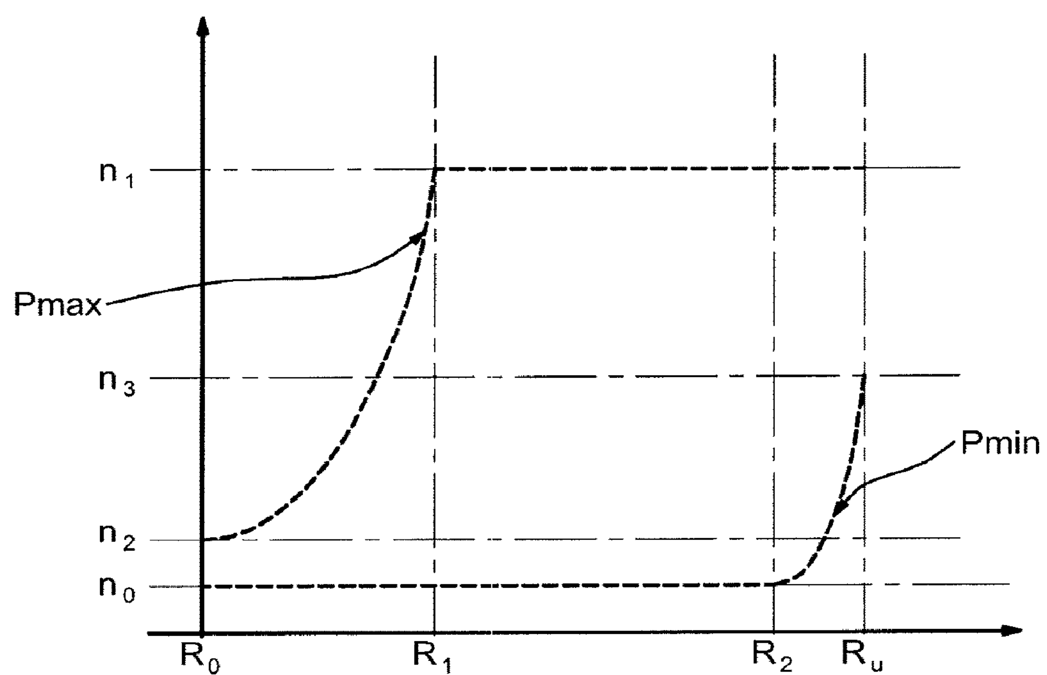
FIG. 3 represents a graph of profiles of maximum and minimum refractive indexes.

As shown by FIG. 3, in the annular peripheral zone 11, the profile of the refractive index, considered in relation to any radial plane, may lie between a maximum profile Pmax and a minimum profile Pmin that are such as defined hereinbelow.

(a) the maximum profile Pmax may be such that between the radius Ro and a radius R1, the value of the maximum refractive index is defined, as a function of the distance from the center of the die r, by the formula:

$$n = n_0 + (n_1 - n_2) \cdot \frac{(r - R_0)^2}{(R_1 - R_0)^2}$$

and then that between this radius R1 and the radius Ru the refractive index is equal to a value $n_1$.

(b) the minimum profile Pmin may be such that between the radius Ro and a radius R2 the refractive index is equal to a value $n_0$, and then that between this radius R2 and the radius Ru, the value of the minimum refractive index is defined, as a function of the distance from the center of the die r, by the formula:

$$n = n_0 + (n_3 - n_0) \cdot \frac{(r - R_2)^2}{(R_u - R_2)^2}$$

(c) moreover, the above refractive indices may be defined with respect to one another in the following manner:

$n_1$ may be greater than $n_0$, $n_2$ may lie between $n_0$ and $n_1$, $n_3$ may lie between $n_1$ and $n_2$, Moreover, the above radii may be defined with respect to one another in the following manner:

R1 may lie between Ro and Ru,

R2 may lie between Ro and Ru.

Various relative values could be adopted. Nevertheless, the following relative values are proposed:

$n_2$ may be equal to $n_0$ plus 2/10 of $(n_1-n_0)$, $n_3$ may be equal to ½ of $(n_1+n_0)$, Ro may be equal to 3/5 of Ru, R1 may be equal to Ro plus ⅓ of (Ru−Ro), R2 may be equal to Ro plus ⅞ of (Ru−Ro).

Moreover, in practice, $n_0$ may lie between 85 and 99% of $n_1$.

Considering the above relative values, examples of index gradients obtained in annular zones 11 of dies 6 and lying between the profiles Pmax and Pmin will now be given.

Figure 4:
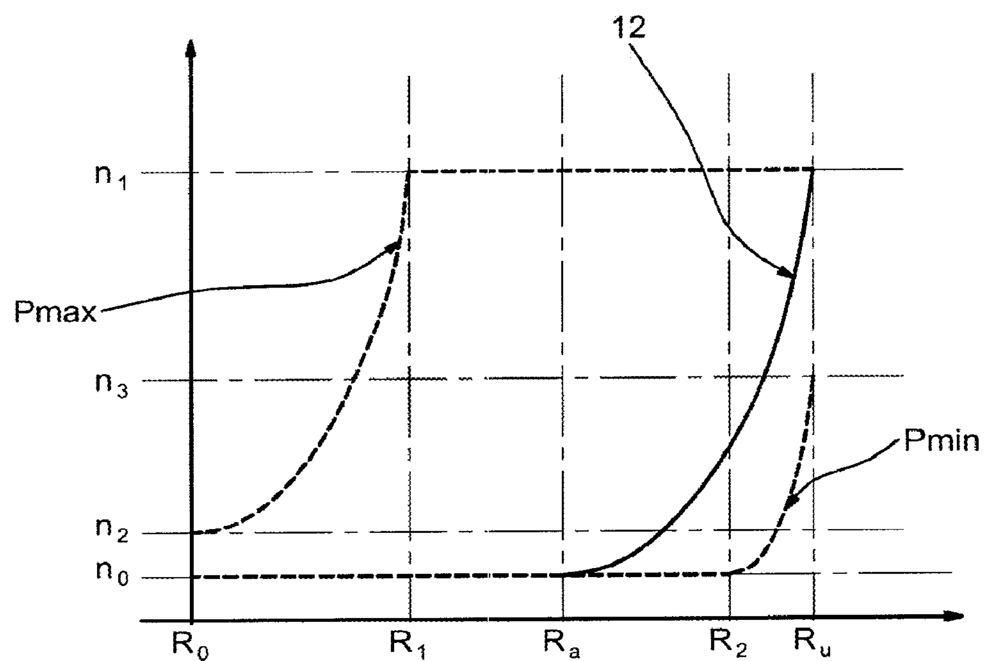
FIG. 4 represents a first exemplary embodiment of a refractive index profile.

Referring to FIG. 4, it may be seen that represented therein is a refractive index profile 12 for a die 6 treated in such a way that this refractive index 12 is at the value $n_0$ between the radius Ro and a radius Ra lying between the radii R1 and R2, and then, starting off tangentially, inflects while increasing up to the value $n_1$ at the radius Ru.

Figure 5:
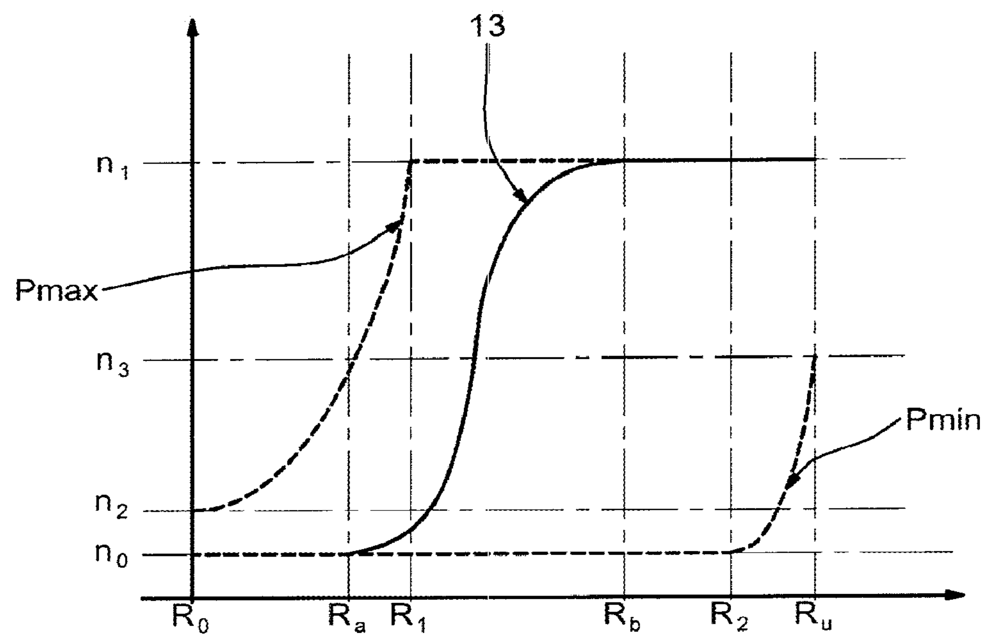
FIG. 5 represents a second exemplary embodiment of a refractive index profile.

Referring to FIG. 5, it may be seen that represented therein is a refractive index profile 13 for a die 6 treated in such a way that this refractive index 13 is at the value $n_0$ between the radius Ro and a radius Ra, lying between the radii Ro and R1, is at the value $n_1$ between a radius Rb, lying between the radius R1 and the radius R2, and the radius Ru and forms an S joining them between Ra and Rb, meeting up with them tangentially.

Figure 6:
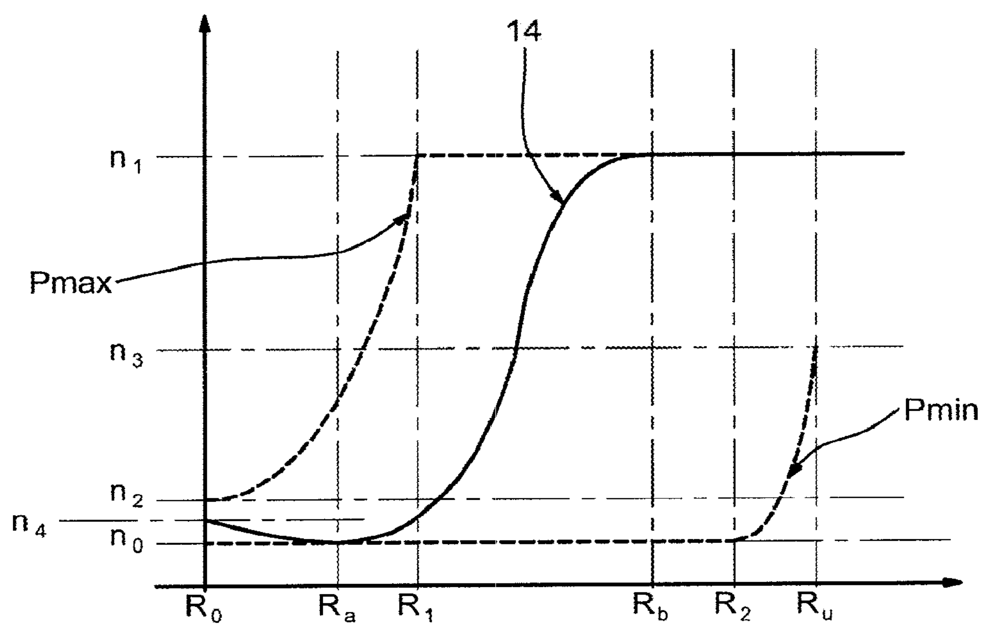
FIG. 6 represents a third exemplary embodiment of a refractive index profile.

Referring to FIG. 6, it may be seen that represented therein is a refractive index profile 14 for a die 6 treated in such a way that this refractive index profile 14 is approximately identical to that of FIG. 5 between the radii Ra and Ru but is distinguished therefrom by the fact that between the radii Ro and Ra, it inflects while decreasing, starting from a value $n_4$ at Ro to meet up tangentially with the value $n_0$ at Ra.

Figure 7:
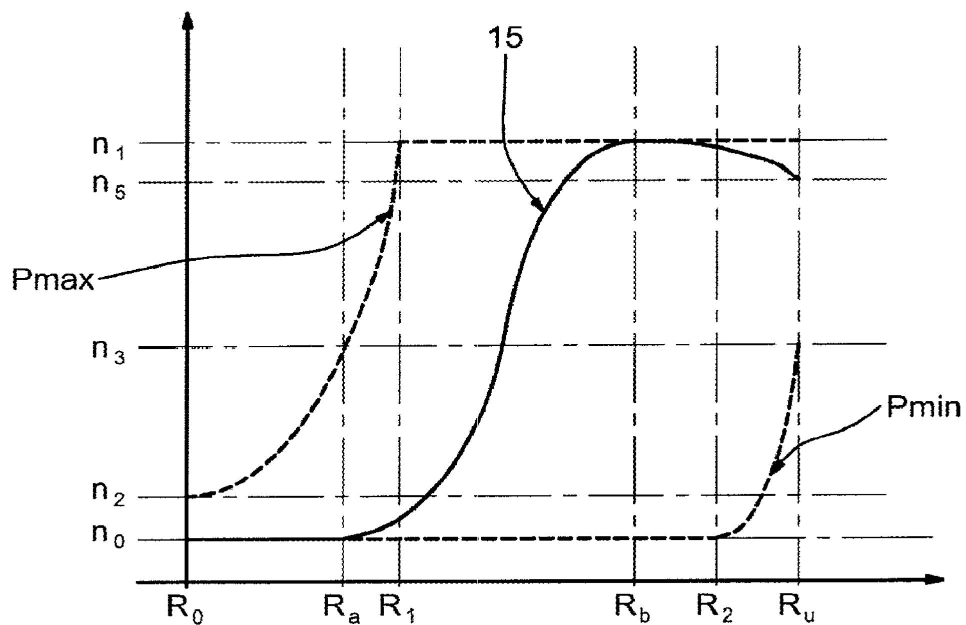
FIG. 7 represents a fourth exemplary embodiment of a refractive index profile.

Referring to FIG. 7, it may be seen that represented therein is a refractive index profile 15 for a die 6 treated in such a way that this refractive index profile 15 is approximately identical to that of FIG. 5 between the radii Ro and Rb but is distinguished therefrom by the fact that between the radii Rb and Ru it inflects while decreasing, starting off tangentially to the value $n_1$ at the radius Rb, to reach a value $n_5$ lying between $n_1$ and $n_3$ at Ru.

Referring to FIGS. 8 to 21, the way in which a die 6 may be treated in order to obtain for example any one of the refractive index gradients hereinabove will now be described.

To obtain the refractive index gradient 12 of FIG. 4, it is possible to proceed as follows.

Figure 8:
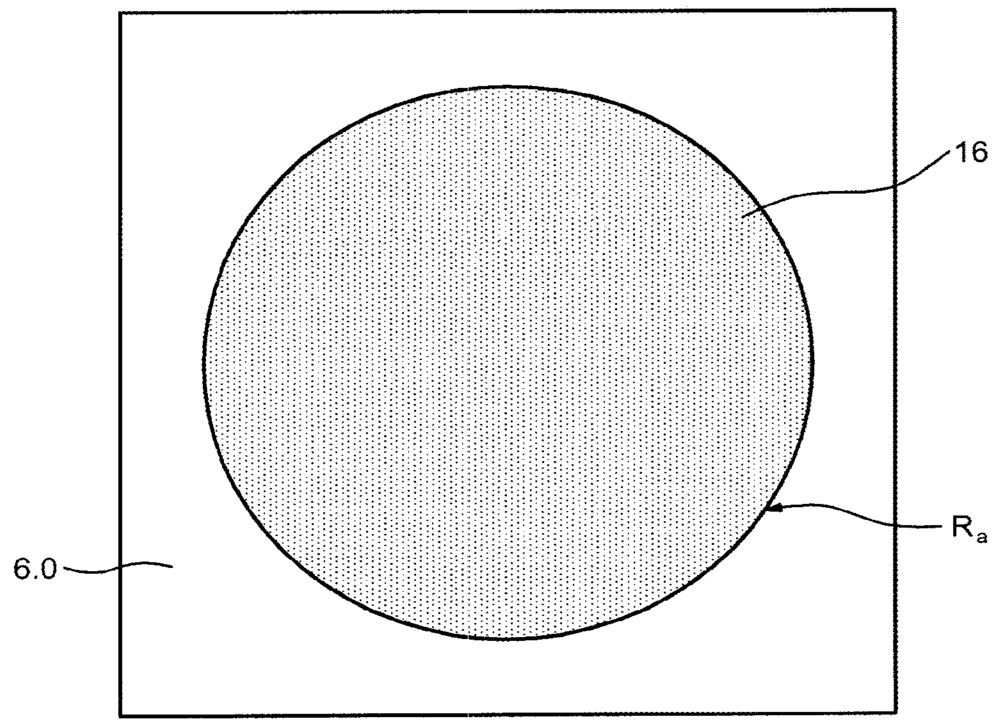
FIG. 8 represents a view from above of a die equipped with a mask.
Figure 9:
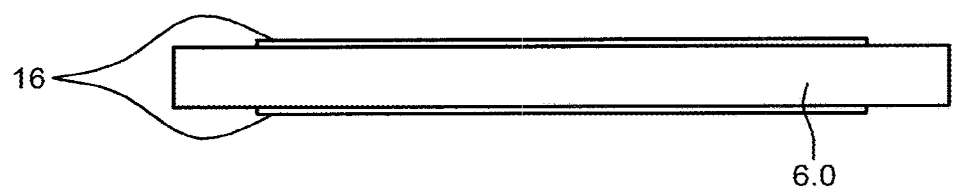
FIG. 9 represents a radial cut through the die of FIG. 8.

As shown by FIGS. 8 and 9, it is possible to start from a die 6.0 exhibiting a refractive index $n_0$, for example uniformly doped with sodium ions.

Masks 16 in the form of discs of radius greater than Ra, that is to say covering the zone inside this radius, are made on the opposite faces thereof, for example by photolithography.

The die 6.0 is immersed in an ion bath to obtain ion diffusion in the material of the die 6, which can be accelerated through the effect of an electric field. The conditions of such treatment are suited to the refractive index gradient 12 to be obtained.

For example, ions of thallium or of silver may be implanted.

The masks 16 may then be removed.

Figure 10:
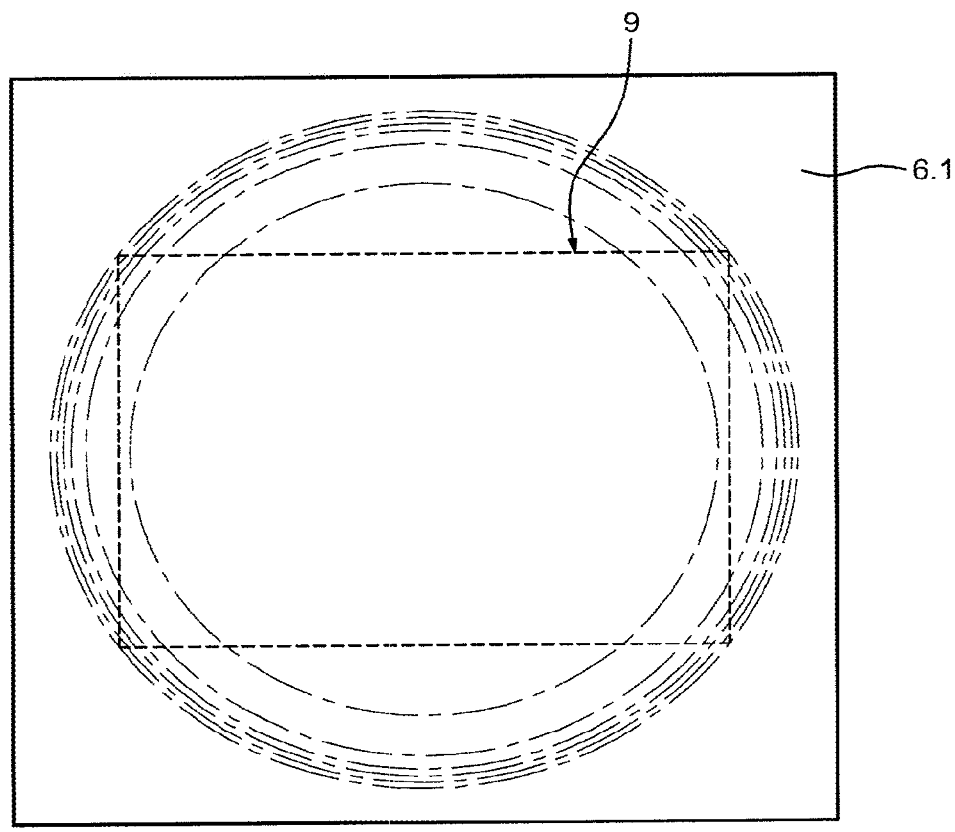
FIG. 10 represents a view from above of the die of FIGS. 8 and 9 after a treatment.
Figure 11:
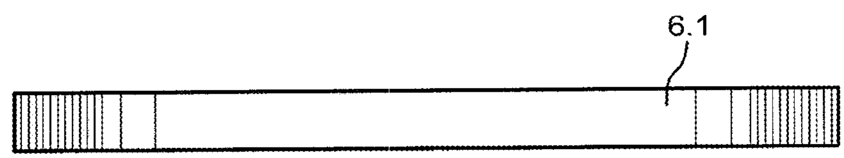
FIG. 11 represents a radial cut through the die of FIG. 10.
Figure 12:
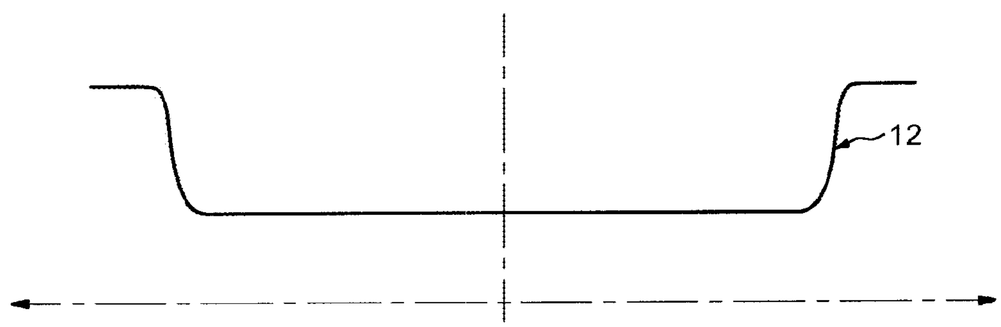
FIG. 12 represents a graph of the profile of the refractive index of the die of FIGS. 10 and 11.

As shown by FIGS. 10, 11 and 12, a die 6.1 is obtained whose refractive index is at the value $n_0$ in its central part and up to the radius Ro, and then its refractive index follows the profile of the gradient 12 between the radii Ra and Ru.

According to a variant execution applied to exchanges of different ions, to obtain a corresponding refractive index profile, it would be possible to make a reverse mask, that is to say make a mask on the external part of the die 6.0, perform an implantation from the middle and then a diffusion towards the outside.

To obtain the refractive index gradient 13 of FIG. 5, it is possible to start from the die 6.1 treated as hereinabove and to apply thereto, in the presence or absence of the masks 16, a suitable complementary treatment of high-temperature ion rediffusion.

In this case, as shown by FIGS. 14 and 15, a die 6.2 is obtained whose refractive index is at the value $n_0$ in its central part and up to the radius Ro, and then its refractive index follows the profile of the gradient 13 up to the radius Rb, and is then at the value $n_1$ up to the radius Ru.

To obtain the refractive index gradient 14 of FIG. 6, it is possible to start from the die 6.1 treated and ridded of the masks 16 and, as shown by FIG. 16, it is possible to make, on the faces of this die 6.1, masks 17 covering the faces of the die and leaving open a disc of radius smaller than or equal to Ra.

The die 6.1 is immersed in an ion bath to obtain ion diffusion in the material of this die, which can be accelerated through the effect of an electric field. The conditions of such a treatment are suited to the refractive index gradient 14 to be obtained.

For example, ions of thallium or of silver may be implanted.

As shown by FIGS. 17 and 18, a die 6.3 is obtained whose refractive index follows the profile of the gradient 14.

Here again, it would be possible to use a reverse mask.

Figure 19:
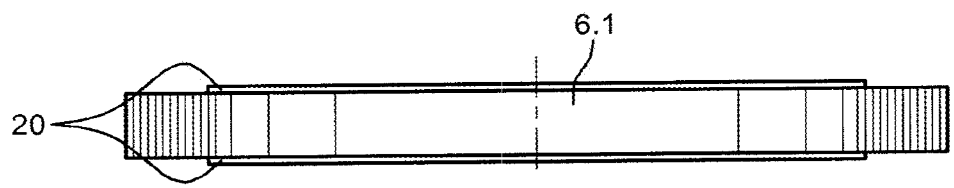
FIG. 19 represents a radial cut through a die equipped with a mask.

To obtain the refractive index gradient 15 of FIG. 7, it is possible to start from the die 6.1 treated and ridded of the masks 16 and, as shown by FIG. 19, it is possible to make, on the opposite faces of this die 6.1, masks 20 in the form of discs going approximately up to a radius greater than Rb.

This die 6.1 is immersed in an ion bath to obtain an ion diffusion in the material of this die, which can be accelerated through the effect of an electric field. The masks 20 are then removed.

For example, sodium ions may be implanted.

A thermal rediffusion could also be carried out.

Figure 20:
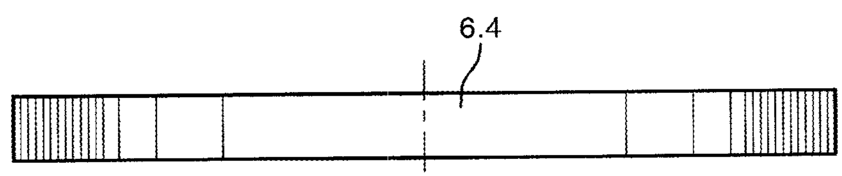
FIG. 20 represents a cut through the die of FIG. 19 after a treatment.
Figure 21:
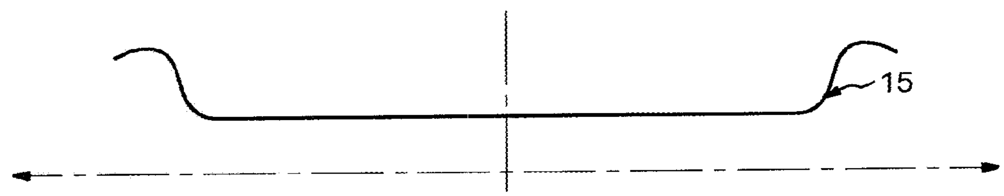
FIG. 21 represents a graph of the profile of the refractive index of the die of FIG. 20.

As shown by FIGS. 20 and 21, a die 6.4 is obtained whose refractive index follows the profile of the gradient 15.

Here again, a reverse mask could be used.

The various profiles of refractive index gradients just described are certainly not the only ones which could be achieved while remaining within the template defined by the profiles Pmax and Pmin. Likewise, the operating modes could be different and the materials and baths used could be different.

The die 6 may advantageously stem from a wafer in which a large number of dies are made simultaneously.

For this purpose, the aforesaid masks are then formed on the wafer at the locations of the dies to be obtained. The ion implantations and the other treatments, if any, are carried out through the opposite faces of this wafer. Grooves and/or through-holes can thus be made in the wafer, outside the optically useful zones 9 of the locations, so as to perform the ion implantations and the other treatments, if any, in particular through the flanks of these grooves and/or through-holes.

The treatments of the wafer having been performed, the wafer is then sawn along perpendicular lines so as to individualize each die 6 treated.

Starting from an original optical module including a transparent die with substantially constant refractive index, the die treatments as described make it possible to reduce the amplitude of an original negative distortion, principally in its periphery, of the captured image.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

The invention claimed is:

1. Apparatus comprising:

an optical module for placement in front of a semiconductor optical image sensor, the optical module comprising a transparent optical die having front and rear parallel surfaces and having a rectangular optically useful zone centered on an optical axis of the semiconductor optical image sensor and a central circular zone within the optically useful zone and also centered on the optical axis, the transparent optical die having a substantially constant refractive index in a first region of the transparent optical die located between the optical axis and an outer edge of the central circular zone, and having a continuously variable refractive index corrective of negative distortion at least in a second region of the transparent optical die located between the outer edge of the central circular zone and an extent of the optically useful zone;

wherein the variable refractive index, in an annular peripheral zone lying between a radius Ru enveloping the rectangular optically useful zone and a smaller radius Ro defining the central circular zone, lies between a maximum profile Pmax and a minimum profile Pmin;

(a) the maximum profile Pmax being such that between the radius Ro and a radius R1, the value of the maximum refractive index is defined, as a function of the distance from the center of the die r, by the formula $$n = n_2 + (n_1 - n_2) \cdot \frac{(r - R_0)^2}{(R_1 - R_0)^2}$$

and then that between this radius R1 and the radius Ru the refractive index is equal to a value $n_1$;

(b) the minimum profile Pmin being such that between the radius Ro and a radius R2 the refractive index is equal to a value $n_0$, and then that between this radius R2 and the radius Ru, the value of the minimum refractive index is defined, as a function of the distance from the center of the die r, by the formula $$n = n_0 + (n_3 - n_0) \cdot \frac{(r - R_2)^2}{(R_u - R_2)^2}$$

(c) and in which:

$n_1$ is greater than $n_0$, $n_2$ lies between $n_0$ and $n_1$, $n_3$ lies between $n_1$ and $n_2$, R1 lies between Ro and Ru, R2 lies between Ro and Ru.

2. The apparatus of claim 1 wherein the variable refractive index in the second region varies as a function of radial distance from the optical axis and has an initial refractive index value equal to a value of the substantially constant refractive index in the first region.

3. The apparatus of claim 2 wherein the function for the variable refractive index is substantially the same for all radial planes extending from the optical axis.

4. The apparatus of claim 1 wherein a radius of the central circular zone is approximately one-half a shortest side length of the rectangular optically useful zone.

5. The apparatus of claim 1 wherein the variable refractive index in the second region varies from a first, relatively lower, refractive index at the outer edge of the central circular zone equal to a value of the substantially constant refractive index in the first region towards a second, relatively higher, refractive index for radial distance farther from the optical axis than the outer edge of the central circular zone.

6. The apparatus of claim 1 wherein the variable refractive index increases with radial distance from the optical axis in the second region.

7. The apparatus according to claim 1, in which:

Ro is equal to ⅗ of Ru,

R1 is equal to Ro plus ⅓ of (Ru−Ro),

R2 is equal to Ro plus ⅞ of (Ru−Ro).

8. The apparatus according to claim 7, in which:

$n_2$ is equal to $n_0$ plus 2/10 of $(n_1-n_0)$, $n_3$ is equal to ½ of $(n_1+n_0)$.

9. The apparatus according to claim 1, in which implanted ions determine the variation in refractive index.

10. The apparatus according to claim 1, exhibiting grooves and/or through-holes situated outside the rectangular optically useful zone.

* * * * *